United States Patent
Lee et al.

(10) Patent No.: US 7,381,283 B2
(45) Date of Patent: Jun. 3, 2008

(54) METHOD FOR REDUCING SHRINKAGE DURING SINTERING LOW-TEMPERATURE-COFIRED CERAMICS

(75) Inventors: Wen-Hsi Lee, Kaohsiung (TW); Che-Yi Su, Kaohsiung (TW); Chun-Te Lee, Kaohsiung (TW)

(73) Assignee: Yageo Corporation (CN)

( * ) Notice: Subject to any disclaimer, the term of this patent is extended or adjusted under 35 U.S.C. 154(b) by 46 days.

(21) Appl. No.: 10/829,010

(22) Filed: Apr. 21, 2004

(65) Prior Publication Data

US 2004/0196638 A1 Oct. 7, 2004

Related U.S. Application Data

(63) Continuation-in-part of application No. 10/224,949, filed on Aug. 20, 2002, now abandoned.

(30) Foreign Application Priority Data

Mar. 7, 2002 (TW) ............................... 91104260 A

(51) Int. Cl.
*C03B 29/00* (2006.01)
*H01L 23/02* (2006.01)
(52) U.S. Cl. ................... 156/89.12; 156/89.16
(58) Field of Classification Search ............. 156/89.12, 156/89.16
See application file for complete search history.

(56) References Cited

U.S. PATENT DOCUMENTS 4,654,095 A 3/1987 Steinberg
5,085,720 A 2/1992 Mikeska et al.
5,130,067 A 7/1992 Flaitz et al.
5,254,191 A 10/1993 Mikeska et al.

(Continued)

FOREIGN PATENT DOCUMENTS

EP 1 209 734 5/2002

(Continued)

OTHER PUBLICATIONS

Drozdyk, "Capacitors Buried in Green Tape", Proc. Spie-Int. Soc. Opt. Eng., vol. 2105, 1993, pp. 209-214.

(Continued)

*Primary Examiner*—Melvin C Mayes
(74) *Attorney, Agent, or Firm*—Merchant & Gould P.C.

(57) ABSTRACT

The present invention mainly relates to a method for reducing shrinkage during sintering low-temperature-cofired ceramics, the ceramics comprising a dielectric portion and a heterogeneous material portion, the method comprising the steps of: (a) providing a monolithic structure, the monolithic structure comprising a dielectric body and a constraining layer; the dielectric body comprising at least one dielectric layer that comprises at least one active area; wherein said active area is disposed with at least one heterogeneous material pattern; the constraining layer positioned on the top of the dielectric body comprising at least one window wherein the edge of the active area of the dielectric layer each falls within the edge of the window in the vertical direction; (b) firing the monolithic structure; and (c) singulating the monolithic structure along a cutting line to provide the low-temperature-cofired ceramics, wherein the cutting line is disposed in the area formed between the edge of the window and the edge of the active area.

3 Claims, 6 Drawing Sheets

U.S. PATENT DOCUMENTS

| | | |
|---|---|---|
| 5,370,759 A | 12/1994 | Hakotani et al. |
| 5,674,351 A | 10/1997 | Lovoi |
| 5,958,165 A | 9/1999 | Takeuchi et al. |
| 6,488,795 B1 * | 12/2002 | Sakai ................. 156/89.17 |
| 6,607,620 B2 * | 8/2003 | Knickerbocker et al. 156/89.16 |

FOREIGN PATENT DOCUMENTS

| | | | |
|---|---|---|---|
| JP | 49-37921 | * | 4/1974 |
| JP | 58-115838 | * | 7/1983 |
| JP | 4-98895 | | 3/1992 |
| JP | 7-30253 | | 1/1995 |
| JP | 8-46360 | | 2/1996 |
| JP | 2001-111223 | | 4/2001 |
| JP | 2001-158670 | * | 6/2001 |
| JP | 2002-9438 | | 1/2002 |
| JP | 2002-16360 | | 1/2002 |
| JP | 2002-50869 | | 2/2002 |

OTHER PUBLICATIONS

Mason, "Parts Fabrication Processing Factors and Their Effects on Sintered Dielectric Tape Shrinkage for Low Temperature Cofired Ceramic Packages", Ishm 92 Proc. of the International Symposium on Microelectronics, Spie, vol. 1847, Oct. 1992, pp. 479-484.

* cited by examiner

METHOD FOR REDUCING SHRINKAGE DURING SINTERING LOW-TEMPERATURE-COFIRED CERAMICS

BACKGROUND OF THE INVENTION

This application is a continuation-in-part of application Ser. No. 10/224,949, filed Aug. 20, 2002 now abandoned, which is incorporated by reference herein in its entirety.

1. Field of the Invention

The present invention relates to a method for reducing shrinkage during sintering low-temperature-cofired ceramics by means of applying a constraining layer with windows on it. The present invention does not need to remove the constraining layer after firing so as to avoid possible damage to the surface flatness of ceramics in conventional technologies, and also simplifies the process procedures to lower the production cost. Therefore, multilayer ceramics with high quality is produced by the invention.

2. Description of the Related Art

Interconnect circuit boards are necessary for modern electronic products to meet the requirement of being light, thin and small. The interconnect circuit boards are either electronic circuits interconnecting each other electrically or mechanically, or subsystems from a number of extremely small circuit components combined in an arrangement. Such circuit components can be physically isolated and mounted adjacent to one another in a single interconnect circuit board to electrically connect to each other and/or extend from the interconnect circuit board thereby.

In the interconnect circuit board, complex electronic circuits generally require that several insulating dielectric layers be used to separate layers of conductors. The electrically conductive pathways interconnecting conductive layers through the dielectric are called vias. Such a multilayer structure allows a circuit to be more compact and occupy less space.

Among various methods for making a multilayer circuit, the method described in U.S. Pat. No. 4,654,095 is by co-firing a multiplicity of ceramic tape dielectrics on which heterogeneous materials such as resistors, capacitors, or conductors have been printed with metallized vias extending through the dielectric layers to interconnect various conductive layers. The dielectric layers are stacked in registry and pressed together at a proper temperature and pressure, and then fired to drive off the organics such as binders and plasticizers in the green ceramic body. All the ceramic and heterogeneous materials are sintered and densified thereby. This method has the advantages of performing firing only once, saving fabricating time and labor, and limiting the diffusion of mobile metals to prevent shorting between the conductive layers. However, because the sintering shrinkage behavior between the ceramics and heterogeneous materials is not the same, the firing condition is difficult to control. Furthermore, this X-Y dimensional uncertainty, resulting in misregistration during assembly of large and complex circuits, is particularly undesirable.

Nowadays, almost all shrinkages are controlled in the Z-direction to reduce X-Y dimensional shrinkage. Such processes are disclosed in U.S. Pat. No. 5,085,720 (E. I. Du Pont de Nemours and Company) and U.S. Pat. No. 5,130,067 (International Business Machines Corporation), which are incorporated herein as references.

In U.S. Pat. No. 5,085,720, the top and bottom of the green ceramic body each are applied with a release layer to form a "sandwich" structure. During burning out and sintering, a unidirectional pressure is applied to the surface of the release layer. The porosity of the release layer provides an escape pathway for the volatile components of the green ceramic body. Because the release layer does not shrink in firing, the X-Y shrinkage of the green ceramic body is reduced. However, the release layers cover both the top and bottom surfaces of the green ceramic body, and their removal should be performed after sintering for printing with and firing the conductors, resistors, and capacitors thereon. The cost of the method thus rises. In addition, the penetration of the inorganic binder contained in the release layer into the green body, and the contact angle, the viscosity, the porosity and the pore size of the release layer all affect the flatness of the ceramics surface during the removal of the release layer, and can easily make the circuit printing difficult and the products defective. When fabricating a large number of ceramic layers (e.g., more than 6 layers), middle layers of a dielectric body still shrink as the result of the forces not being distributed evenly by applying the release layers on the top and bottom of the green body (i.e., the forces on the top and the bottom and on the middle layers of the green body are substantially different).

U.S. Pat. No. 5,130,067 has described three approaches to reduce X-Y shrinkage of a dielectric body. With the first approach, constraint is applied to the outer edges of the dielectric body to provide an open escape path for volatiles and an entry path for oxygen. With the second approach, a co-extensive force is applied to the entire surface of the dielectric body by either using a co-extensive porous platen or by application of an air-bearing force to the surface. With the third approach, a frictional force is applied to the green body by use of a porous contact sheet which does not shrink or expand during firing. The contact sheet comprises a porous composition selected so that it remains porous during firing, does not fuse to the ceramics, is thermally stable and has continuous mechanical integrity/rigidity. The contact sheet maintains its dimensions during sintering and thus restricts the ceramic part from shrinking. After sintering, the contact sheet is removed by means of an appropriate removal procedure, such as polishing and scraping, which will not damage the surface of the ceramics. However, the three approaches described above have disadvantages. For example, the first approach easily leads to shrinkage of the ceramics and further affects shape of the circuit and flatness of the ceramics surface because it uses a weight produced by a fixture to reduce the shrinkage and the pressure distributes unevenly on the dielectric body. The second and third approaches need removal steps after firing, and the cost increases and the surfaces are damaged also.

In order to resolve the problems mentioned above, the present invention develops a novel method for reducing shrinkage during sintering low-temperature-cofired ceramics to save cost and improve the quality of the ceramic product.

SUMMARY OF THE INVENTION

The present invention mainly relates to a method for reducing shrinkage during sintering low-temperature-cofired ceramics, the ceramics comprising a dielectric portion and a heterogeneous material portion, the method comprising the steps of:

(a) providing a monolithic structure, the monolithic structure comprising:

a dielectric body comprising at least one dielectric layer that comprises at least one active area; wherein said active area is disposed with at least one heterogeneous material pattern, and said heterogeneous material pattern comprises at least one heterogeneous material component and/or module; and a constraining layer positioned on the top of the dielectric body, the constraining layer comprising at least one window, wherein the edge of the active area of the dielectric layer each falls within the window in vertical direction;

(b) firing the monolithic structure; and (c) singulating the monolithic structure along a cutting line to provide the low-temperature-cofired ceramics, wherein the cutting line is disposed in the area formed between the edge of the window and the edge of the active area.

DETAILED DESCRIPTION OF THE INVENTION

The present invention provides a method for reducing shrinkage during sintering low-temperature-cofired ceramics, which is preferably applied to/during fabricating multiplayer ceramic circuits using conventional conductive metallizations, resistors, capacitors, conductors, inductors, chips or modules. The method according to the invention has the advantages of reducing the X-Y dimension shrinkage during sintering the low-temperature-cofired ceramics and avoiding removal of the constraining layer after firing so as to prevent possible damage to the surface flatness.

Figure 1:
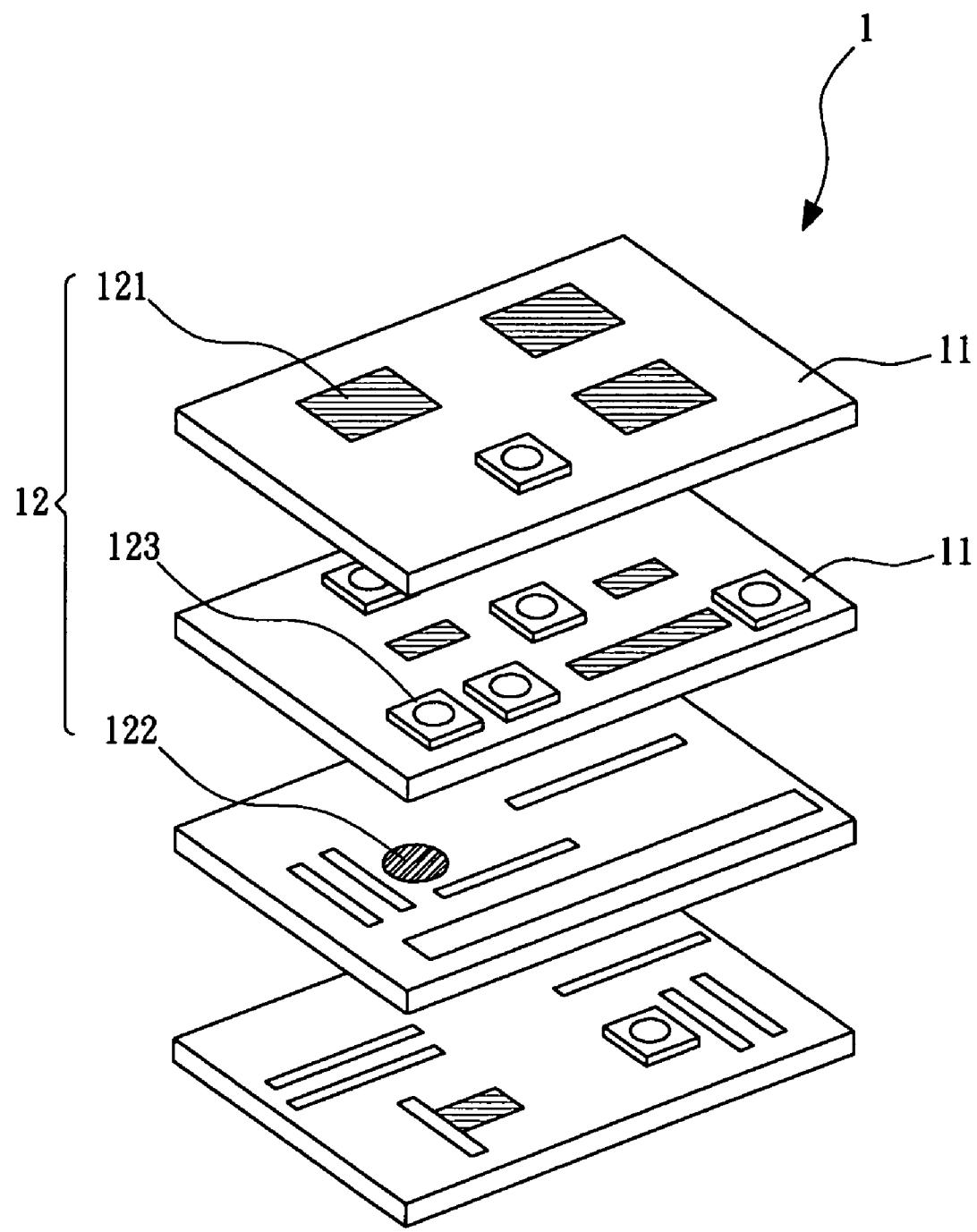
FIG. 1 illustrates an exploded perspective view of the low-temperature-cofired ceramics.

Referring to FIG. 1, the low-temperature-cofired ceramics 1 according to the invention comprises a dielectric portion 11 and a heterogeneous material portion 12. The dielectric portion 11 comprising a plurality of dielectric layers on which the heterogeneous material portion 12 such as resistors, capacitors, conductors, inductors, chips, or modules has been disposed thereon with metallized vias extending through the dielectric body to interconnect various heterogeneous material on different dielectric layers. The heterogeneous material portion 12 comprises a surface mounted active component or module 121, a via 122 and a buried component or module 123. The surface mounted active component or module 121 positioned on the surface of the outermost dielectric layer may be fabricated to the dielectric layer after firing the dielectric layer or cofired with the dielectric layer. The via 122 is a conductive pathway interconnecting the heterogeneous material portion 12 through the dielectric portion 11. The dielectric portion 11 is punched and filled with a conductive material, usually silver, to provide the via 122. The buried component or module 123 is buried within the dielectric layers and interconnected each other on the different layers by the via 122. By including multiple layers, the heterogeneous material interconnects can be distributed on and/or within the dielectric layers. Heterogeneous material interconnects positioned within the dielectric layer minimizes the required area necessary to hold an electronic circuit since now the heterogeneous material interconnects can be routed in three dimensions.

The step (a) of the method according to the invention is providing a monolithic structure 2 (referring to FIGS. 2 to 4) comprising a dielectric body 3 and a constraining layer 22.

Figure 2:
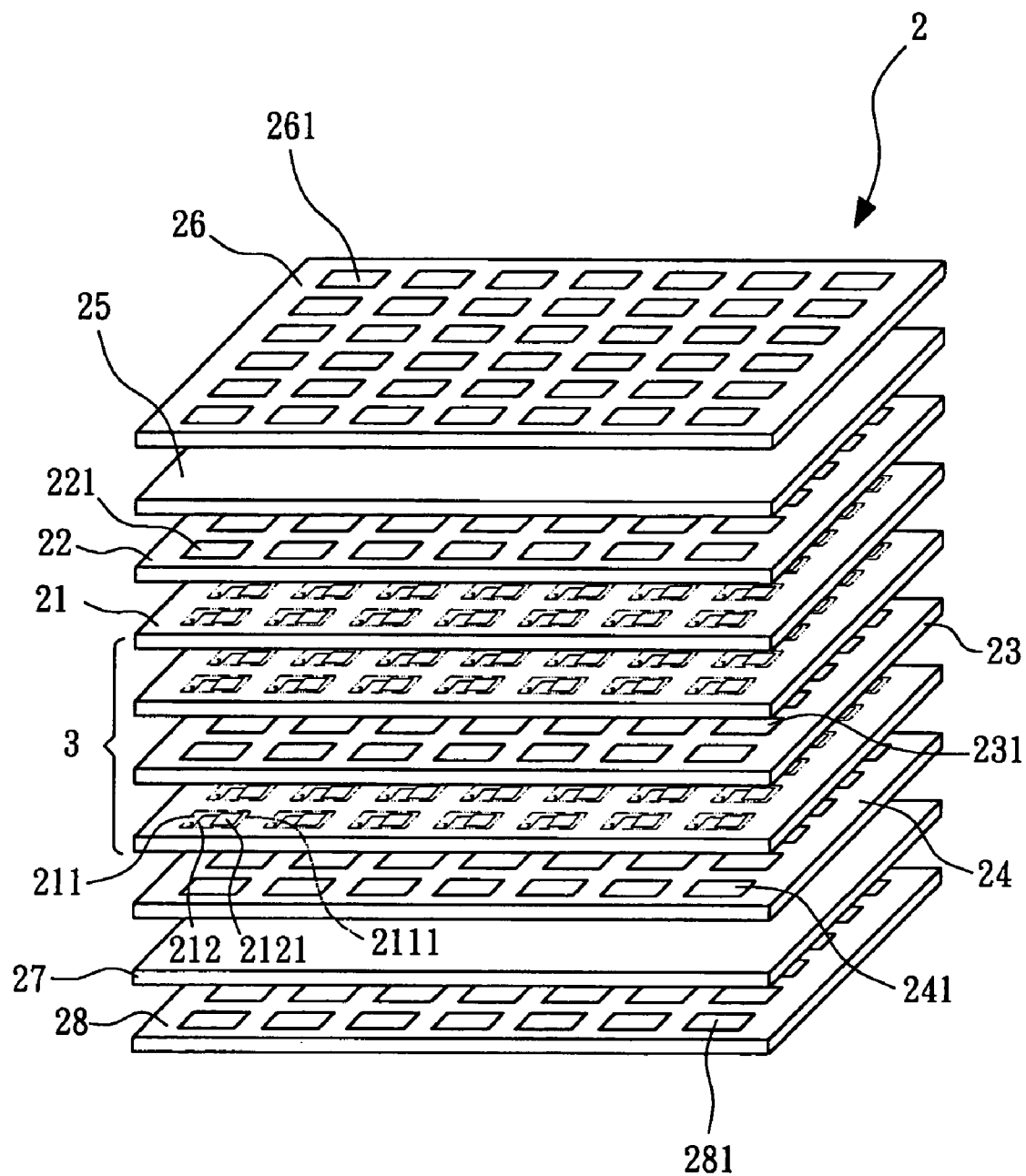
FIG. 2 illustrates an exploded perspective view of the monolithic structure according to one embodiment of the invention.
Figure 4:
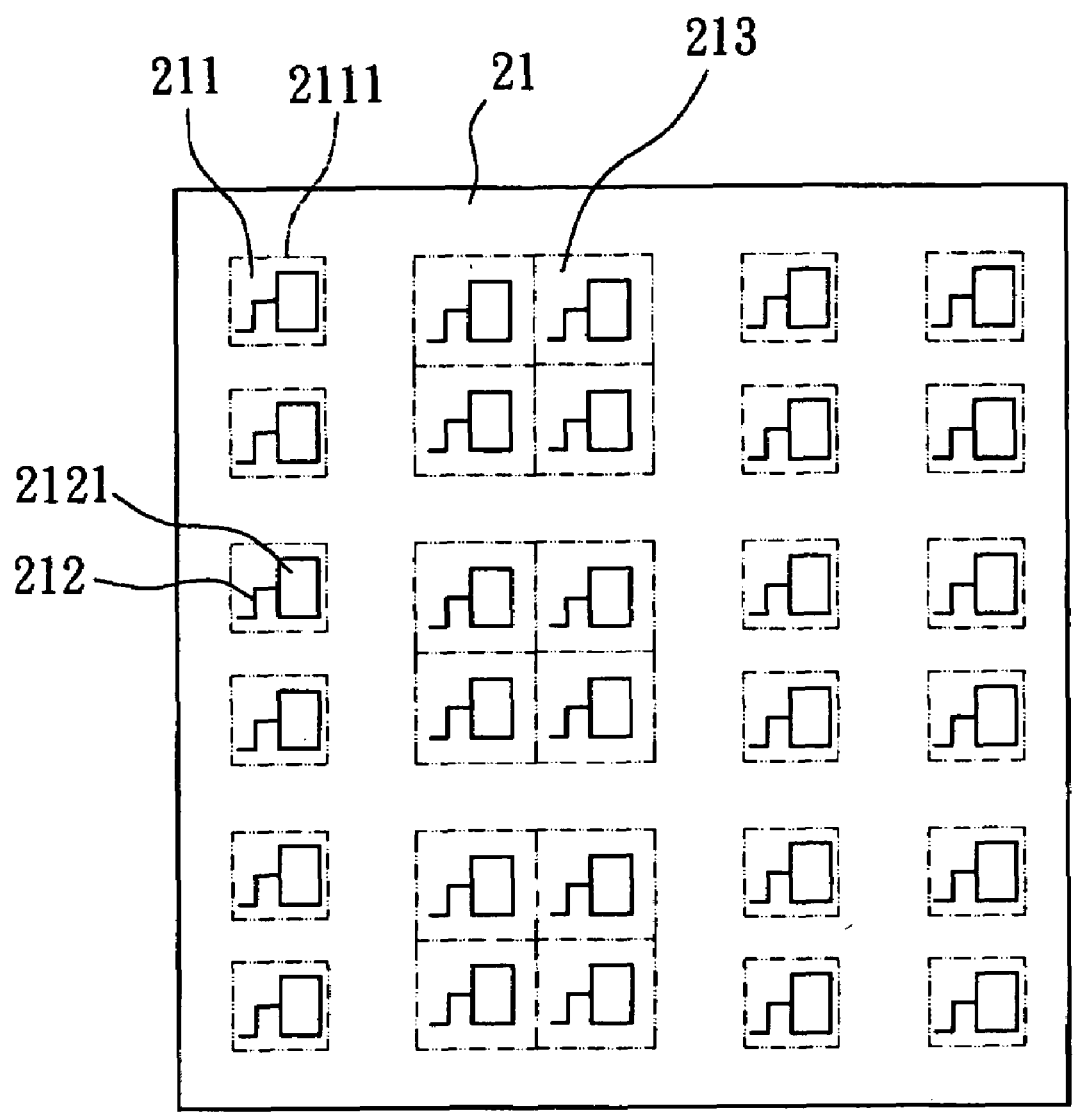
FIG. 4 illustrates a top view of the monolithic structure according to one embodiment of the invention.

Referring to FIGS. 2 and 4, the dielectric body 3 comprises at least one dielectric layer 21. The dielectric layer 21 comprises at least one active area 211 which is disposed with at least one heterogeneous material pattern 212, and said heterogeneous material pattern 212 comprises at least one heterogeneous material component and/or module 2121. The dielectric layer constitutes the dielectric portion of the low-temperature-cofired ceramics after firing, and the heterogeneous material pattern constitutes the heterogeneous material portion of the low-temperature-cofired ceramics. The heterogeneous material component and/or module 2121 according to the invention comprise(s) resistors, capacitors, conductors, inductors, chips or modules to form the heterogeneous material pattern 212. In one preferred embodiment of the invention, the dielectric layer comprises a plurality of active areas 211, and each of the active areas 211 is for producing one part of one low-temperature-cofired ceramics.

Figure 3:
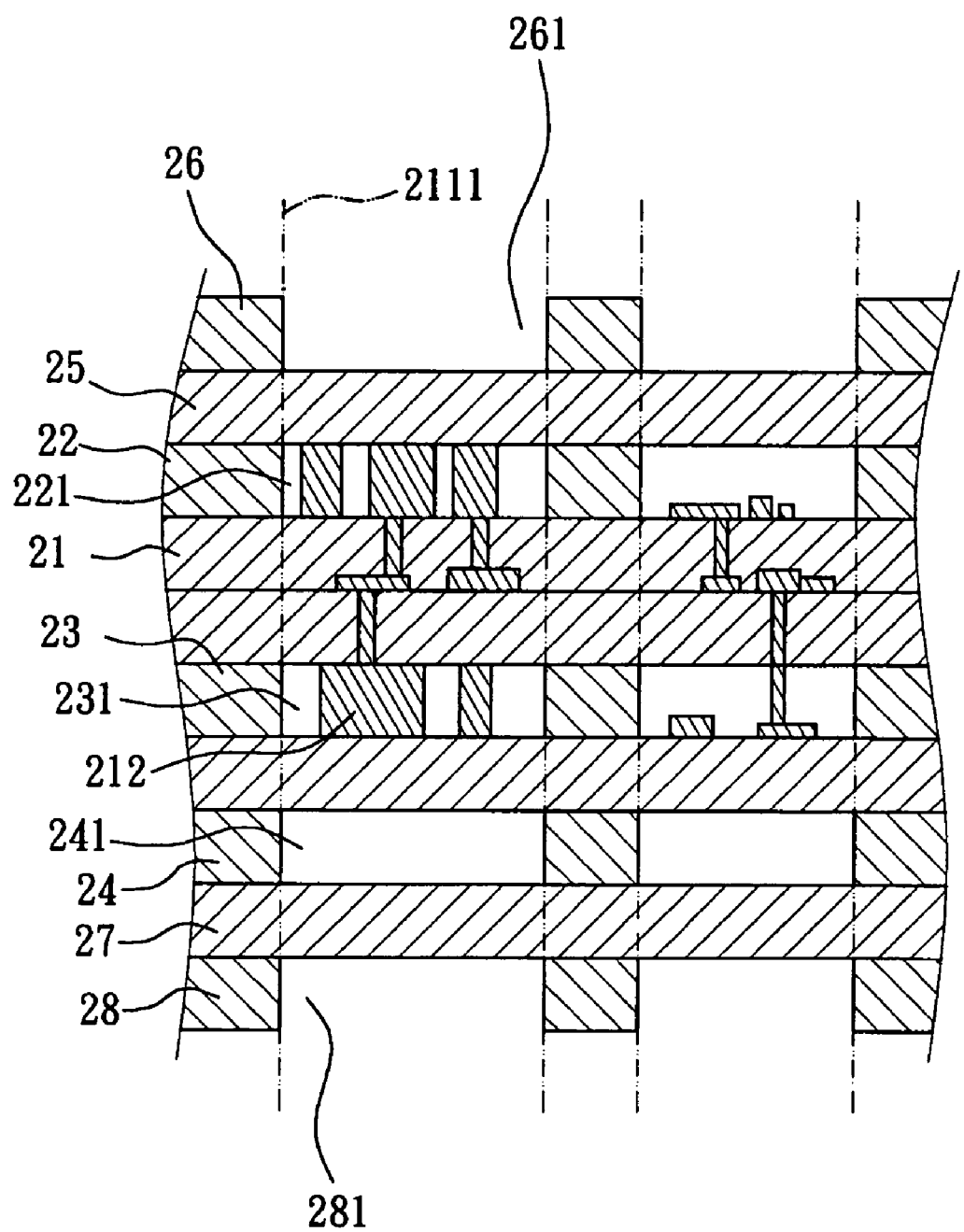
FIG. 3 illustrates a cross section view of the monolithic structure according to one embodiment of the invention.

Referring to FIGS. 2 and 3, the constraining layer 22 is positioned above the dielectric body 3. The constraining layer 22 comprises at least one window 221. The edge 2111 of the active area 211 of the dielectric layer each falls within the window 221 in vertical direction so as to expose the heterogeneous material pattern 212 of the dielectric layer.

In one embodiment of the invention, the edge of the active area 211 each falls within the window (not shown) in vertical direction. In another embodiment of the invention, the edges of a plurality of the active areas 213 as a whole each fall within the windows, e.g., the window (as shown in FIG. 4).

In one preferred embodiment of the invention, the dielectric body 3 comprises at least two of the dielectric layers. The edge 2111 of the active area 211 of any of the dielectric layer each falls within the window 221 of the constraining layer 22 in vertical direction. Provided with the at least two dielectric layers, the method according to the invention has the ability to produce multilayer ceramics. The heterogeneous material pattern of each dielectric layer constitutes one part of a circuit, and by interconnecting that of other dielectric layer by vias, it forms a complete circuit.

In another preferred embodiment of the invention, the dielectric body 3 further comprises a constraining layer 23 positioned between the dielectric layers. The constraining layer 23 comprises at least one window 231, and the edge 2111 of the active area of the dielectric layer each also falls within the window 231 of the constraining layer 23 in vertical direction. The window 231 of the constraining layer 23 may be larger or less than the window 221 of the constraining layer 22. Preferably, the size and position of the window 231 of the constraining layer 23 contained in the dielectric body 3 are the same to those of the window 221 of the constraining layer 22 positioned above the dielectric body 3. Applying the constraining layer 23 in the dielectric body 3, the method according to the invention can be used to produce multilayer ceramics with even more than six dielectric layers and still avoid shrinkage in the X-Y dimension during sintering.

The thickness of the constraining layer ($L_1$) applied between the dielectric layers of the dielectric body is preferably not thinner than the thickness of the heterogeneous material pattern ($L_2$) disposed on the dielectric layer positioned adjacent and below the constraining layer, and more preferably, the $L_1$ is equal to $L_2$ ($L_1=L_2$) to enhance the evenness of the monolithic structure.

In still another preferred embodiment of the invention, the monolithic structure 2 further comprises a constraining layer 24 positioned on the bottom of the dielectric body 3. Preferably, the constraining layer 24 comprises at least one window 241, and the edge 2111 of the active area 211 of the dielectric layer each falls within the window 241 of the constraining layer 24 in vertical direction. Two constraining layers are individually positioned on the top and bottom of the dielectric body to form a "sandwich" structure to reduce the shrinkage in the X-Y dimension. If the constraining layer positioned on the bottom of the dielectric body does not have any windows, it can be retained as the bottom of the low-temperature-cofired ceramics product. On the other hand, if the constraining layer positioned on the bottom of the dielectric body has windows, it is removed from the low-temperature-cofired ceramics product by a singulating step, such as that discussed below.

The thickness of the constraining layer ($L_3$) positioned on the top or bottom of the dielectric body is related to that of the dielectric body ($L_4$) with or without any constraining layer. If the ratio of $L_4/L_3$ is less than about 3.5, the shrinkage rate of the monolithic structure in the X-Y dimension would be less than about 0.5%. Therefore, a ratio ($L_4/L_3$) of the total thickness of the dielectric body ($L_4$) and the thickness of the constraining layer ($L_3$) positioned on the top or bottom of the dielectric body is preferably less than about 3.5.

In one preferred embodiment of the invention, the monolithic structure 2 further comprises a cover layer 25 and a constraining layer 26. The cover layer 25 is positioned on the constraining layer 22, and the constraining layer 26 is positioned on the cover layer 25. The cover layer is made up of a dielectric material or any other suitable material. Preferably, the constraining layer 26 comprises at least one window 261, and the edge 2111 of the active area 211 of the dielectric layer each falls within the window 261 of the constraining layer 26 in vertical direction. The cover layer 25 and the constraining layer 26 protect the dielectric body 3 from contacting the die during firing. The cover layer 25 may be preserved on or removed from the low-temperature-cofired ceramics product. If the cover layer 25 is preserved on the low-temperature-cofired ceramics product, a heterogenous material pattern, such as a heterogeneous material component and/or module can be positioned thereon as a surface mounted active component or module.

Furthermore, the monolithic structure 2 preferably comprises a cover layer 27 and a constraining layer 28. The cover layer 27 is positioned on the bottom of the dielectric body 3 with or without the constraining layer 24 and the constraining layer 28 is positioned below the cover layer 27. Preferably, the constraining layer 28 comprises at least one window 281, and the edge 2111 of the active area 211 of the dielectric layer each falls within the window 281 of the constraining layer 28 in vertical direction. The cover layer 27 and the constraining layer 28 protect the dielectric body from contacting the die during firing. The cover layer 27 may be preserved on or removed from the low-temperature-cofired ceramics product.

According to the invention, the dielectric layers and the constraining layers can be laminated in the way of a constraining layer (disposed on the top of the dielectric body)—m dielectric layers and n constraining layers alternated in the dielectric body—a constraining layer (disposed on the bottom of the dielectric body) to form the monolithic structure, wherein m is greater than n. Preferably, m dielectric layers and n constraining layers are alternated to form a dielectric body, wherein m is equal to n+1.

Figure 5:
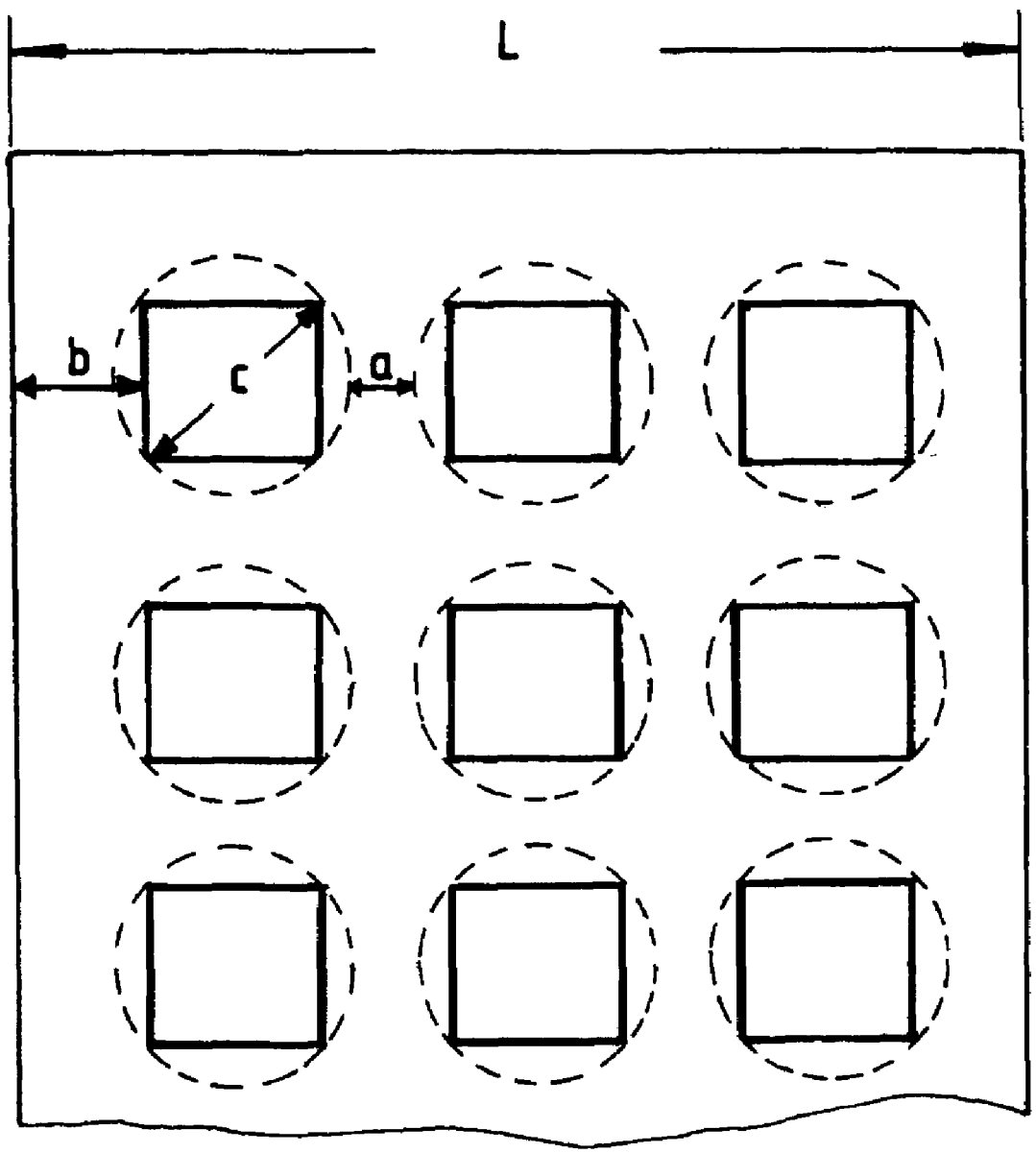
FIG. 5 illustrates a top view of the constraining layer according to an embodiment of the invention, wherein L is a shortest length of the constraining layer; c is a diameter of a circumscribed circle of each window; a is a distance between the adjacent circumscribed circles; and b is a distance between the most outside window and an edge of the constraining layer.

In a preferred embodiment of the invention, a constraining layer with the shortest length L is punched to form at least one window thereon (referring to FIG. 5). The window can be in any shape in a circumscribed circle with the diameter c, the distance between the adjacent circumscribed circles is a, and the distance between the outermost window and the edge of the constraining layer is b; wherein $c<0.5L$, $a>0.1c$, $b>0.1c$. According to the invention, diameters of each circumscribed circle can be different, provided that the windows in positions for exposing the heterogeneous material pattern are disposed on the dielectric layer.

The dielectric layer of the dielectric body according to the invention may be prepared by any conventional manner known in the art, and, for example, can be made of an admixture of finely divided particles of ceramics solids and sinterable inorganic binder dispersed in a volatilizable solid polymeric binder. In the process of firing, after volatilization of the polymeric binders, the inorganic components of the dielectric body start sintering when heated to an adequate temperature. During sintering, the particulate-porous dielectric body undergoes changes in its structure including an increase in grain size and a change of pore shape, size and number. Sintering unusually produces a decrease in porosity and results in densification of the particulate compact.

Ceramic Solids

The composition of the ceramic solids in the dielectric body used in the invention may be any conventional one. The composition itself is not directly critical so long as the solids are chemically inert with respect to the other materials in the system. The examples of the ceramic solids include inorganic metals, usually metal oxides, and any high melting inorganic solids, and high softening point glasses. Moreover, the ceramic solids may be chosen on the basis of both its dielectric and thermal expansion properties. Thus, mixtures of such materials may be selected in order to match the thermal expansion characteristics of any substrate to which they are applied.

Inorganic Binder

The composition of the inorganic binder according to the invention may be any conventional one. It is chemically inert with respect to the other materials in the system and has the following appropriate physical properties: (1) it has a sintering temperature well below that of the ceramic solids; and (2) it undergoes viscous phase sintering at the firing temperatures used. The inorganic binder suitable for the invention is usually glass, particularly crystallized or non-crystallized glass in firing.

Polymeric Binder

The inorganic bonder and ceramic solids are dispersed in the polymeric binder. The polymeric binder optionally has mixed with other materials such as plasticizers, release agents, dispersing agents, stripping agents, antifouling agents and wetting agents. Any polymeric binder known in the art for producing low-temperature-cofired ceramics is suitable to be used in the present invention.

Dielectric Body

Any conventional dielectric body may be used in the invention. For example, the dielectric body is formed from the dielectric layers made of the ceramic solids, inorganic binder and polymeric binder, on which the heterogeneous material patterns have been disposed with metallized vias extending through the dielectric layers to interconnect various heterogeneous material patterns. The dielectric body generally comprises a glass and ceramic system and a glass-ceramic system.

The main component of the glass and ceramic system is aluminum oxide ($Al_2O_3$). For the purpose of lowering sintering temperature of aluminum oxide and maintaining high frequency of the whole system, glass component, comprising $K_2O$, $B_2O_3$, $SiO_2$, CaO, BaO, SrO or $V_2O_5$ and the mixture thereof, is usually added.

The main component of the glass-ceramic system is a series of Mg—AlSi and Ca—AlSi materials which are ceramic crystals produced by heating non-crystalline of the glass.

Constraining Layer

The constraining layer is made of any materials that reduce shrinkage of the dielectric body during sintering. The constraining layer comprises a high sintering temperature constraining layer and a low sintering temperature constraining layer.

Figure 6:
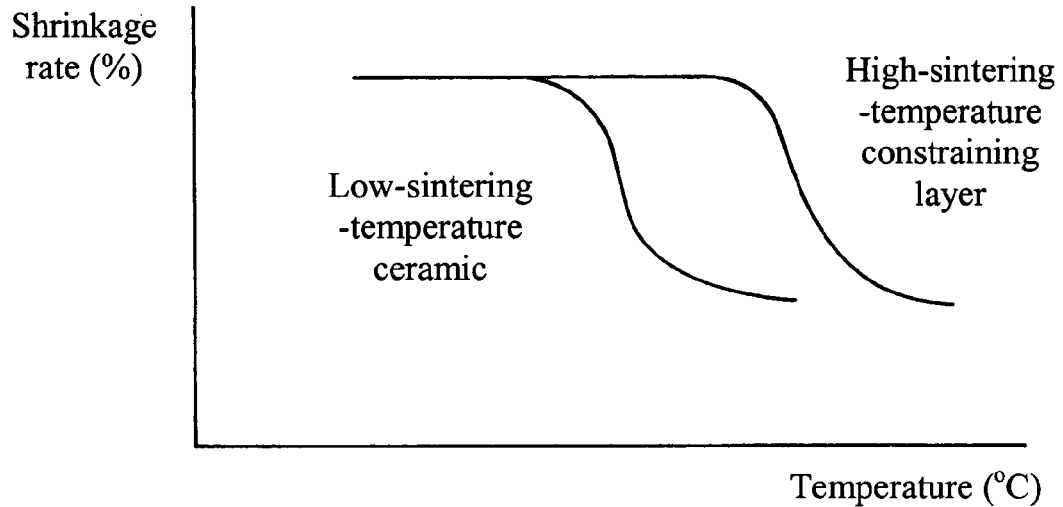
FIG. 6 illustrates a plot of temperature of a high-sintering-temperature constraining layer and low-sintering-temperature ceramics versus the shrinkage rate.

(1) High-sintering-temperature Constraining Layer:

A high-sintering-temperature constraining layer comprises ceramic tapes such as aluminum oxide (sintering at a temperature>1400° C.) (referring to FIG. 6). A common low dielectric, low-sintering-temperature ceramics sinters at about 850° C. At the temperature at which the low-sintering-temperature ceramics starts to sinter, the high-sintering-temperature constraining layer does not shrink because its sintering temperature is higher and is not reached yet. It takes the advantage that the high-sintering-temperature constraining layer does not shrink in the X-Y dimension at about 850° C. so as to inhibit and reduce X-Y dimension shrinkage of the low-sintering-temperature ceramics. The high-sintering-temperature constraining layer may be, for example, the release layer in U.S. Pat. No. 5,085,720, which comprises finely divided particles of non-metallic particles dispersed in a volatilizable organic medium. However, when the release layer is used in the invention, the penetration of the inorganic binder and the contact angle of the release layer need not be considered, and the removal step after firing is also unnecesary. The contact sheet in U.S. Pat. No. 5,130,067 can also be used in the present invention as the high sintering temperature constraining layer, which includes a porous green sheet of alumina, glass, or non-crystallizing glass/ceramics.

Figure 7:
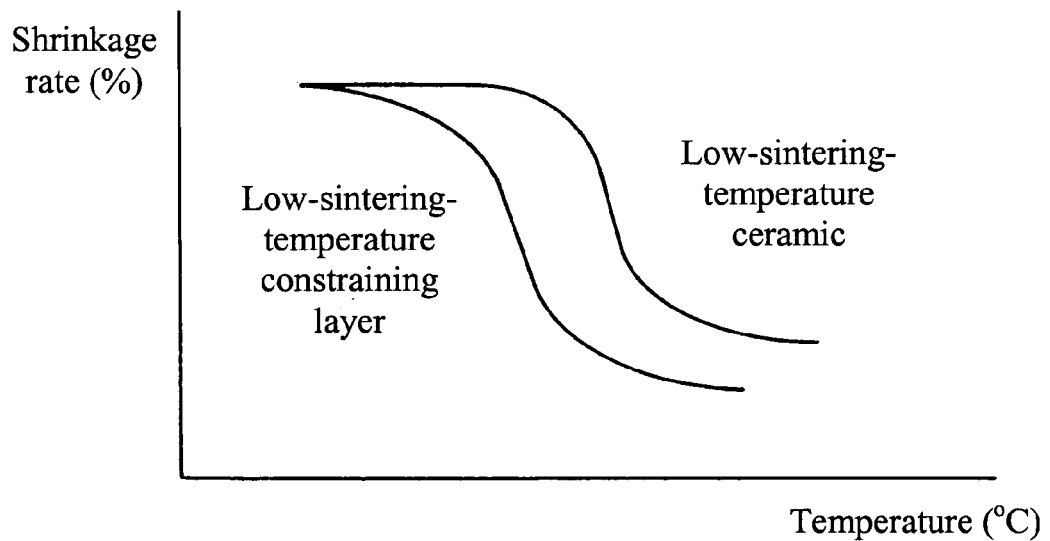
FIG. 7 illustrates a plot of temperature of a low-sintering-temperature constraining layer and low-sintering-temperature ceramics versus the shrinkage rate.

(2) Low-sintering-temperature Constraining Layer:

Being different from the high-sintering-temperature constraining layer described in (1), a low-sintering-temperature constraining layer is added with a strong auxiliary component to lower the sintering temperature of the constraining layer (referring to FIG. 7). That is, before the low-sintering-temperature ceramics starts to sinter, the low-sintering-temperature constraining layer has completed its sintering. When the low-sintering-temperature constraining layer starts to sinter, its X-Y shrinkage is inhibited and reduced by the low-sintering-temperature ceramics which does not shrink at this temperature range. At this moment, the role of the high sintering-temperature constraining layer as stated in (1) is assumed by the low-sintering-temperature ceramics. When the temperature is raised to where the low-temperature-cofired ceramics starts to sinter, the low-sintering-temperature constraining layer has completed its sintering and does not shrink any more and thus the shrinkage in the X-Y dimension of the low-sintering-temperature ceramics is inhibited and reduced thereby. For example, taking aluminum oxide as the low-sintering-temperature constraining layer, the strong auxiliary component may be vanadium oxide or other component, preferably the amount of vanadium oxide is about 1% to about 10% by weight.

The constraining layer is preferably made of porous materials. Not only the windows of the constraining layer but also the pores of the porous materials can provide escape pathways of the dielectric body for volatile gas during firing. As previously described, the constraining layer positioned between the dielectric layers, in addition to on the upper and the bottom of the dielectric body. Because the constraining layer does not shrink during sintering, it inhibits and reduces the shrinkage in the X-Y dimension of the dielectric body and the dielectric layers contained therein by bonding result from the bonding glass between the constraining layer and the dielectric layer or by applying pressure.

The step (b) of the method according to the invention is firing the monolithic structure.

In accordance with the method of the present invention, bonding glass can be used whether or not a pressure is applied during firing.

Conventional method of applying the unidirectional pressure normal to the exposed surface of the monolithic structure used in this field is suitable for the invention. The pressure is sufficient for the constraining layer to contact the dielectric layer, and substantially results in all shrinkage occurring in the Z-direction normal to the monolithic structure. That is, the X-Y dimension of the dielectric layer does not shrink during firing.

The bonding glass should be used when no pressure is applied. The bonding glass can be added into the materials of the constraining layer and/or the dielectric layer directly, or can be in form of a bonding glass layer presented between the constraining layer and the dielectric layer. When being added into the material of the constraining layer directly, the amount of the bonding glass should be neither too high to lead the constraining layer to shrink during sintering, nor too low and does not provide enough binding effect. The constraining layer comprises about 1% to about 10% of bonding glass, and preferably about 1% to about 6%. Taking adding borosilicate glass in an aluminum oxide ($Al_2O_3$) constraining layer as an example, the preferable amount of the borosilicate glass is between about 1% to about 10% by weight, based on the total weight of borosilicate glass and aluminum oxide. When a bonding glass is applied on a surface of the dielectric layer, the bonding glass preferably does not cover the active area. The bonding glass layer is prepared by dissolving glass particles in a proper solvent as an ink, and printed on the dielectric layer or the constraining layer, or added between the dielectric layer and the constraining layer by coating directly, sputter deposition or vapor deposition. Furthermore, the bonding glass (layer) can be used when the pressure is applied. Different bonding glasses can be selected depending on the process need.

In the present invention, the bonding glass is optionally added between the dielectric layer and the constraining layer for bonding. Preferably, the bonding glass is added on a surface of the constraining layer with windows and then applies the constraining layer on the dielectric layer, so that the amount of bonding glass is reduced and the bonding glass will not contact directly with the heterogeneous material pattern. Therefore, the interaction between the bonding glass and the dielectric layer or the constraining layer does not happen directly within the active area. During sintering, partial bonding glass melts and diffuses into the dielectric layer to bond the constraining layer and the dielectric layer together.

The method according to the invention can be used to fabricate ceramic circuits either with or without a prefired refractory substrate backing. The backing may or may not be metallized. In the case of metallized, it may or may not be prefired. If a substrate backing is used, the dielectric body is placed on the substrate backing, followed by the constraining layer. The entire assemblage is then placed in the constraining die or press for firing. If a substrate backing is not used, a constraining layer is placed on both the top and the bottom of the dielectric body.

The step (c) of the method according to the invention is singulating the monolithic structure along a cutting line to provide the low-temperature-cofired ceramics, wherein the cutting line is disposed in the area formed between the edge of the window and the edge of the active area. The process of singulating is well known to artisans skilled in this field. For example, singulating the monolithic structure is conducted by sawing, cutting, laser cutting, or dicing.

Preferably, the method according to the invention further comprises the step (d) singulating the monolithic structure along the edges of the active areas of the dielectric layer. If the edges of a plurality of the active areas 216 as a whole each fall within one of the window 221 (referring to FIG. 4) in vertical direction, each low-temperature-cofired ceramics is singulated thereby.

The present invention has many advantages: (1) Because no shrinkage occurring in the X-Y dimension of the constraining layer, the shrinkage of the monolithic structure is inhibited or reduced by the presence of bonding glass or application of the pressure. (2) The constraining layer need not be removed after firing so that it completely avoids damages occurring on the surface of the dielectric layer, which are resulted from removing the porous contact sheet or the release layer in the prior art. The surface of the ceramics manufactured by the method of the invention is very smooth (surface roughness $R_a < 0.2$ μm). The fabricated capacitors, resistors or flip-chip integrated circuit is more precise in size. The cost of removal is avoided thereby. (3) The windows of the constraining layer can provide escape pathways for the gas when firing the monolithic structure. (4) The pollution resulted from the monolithic structure contacting the die is prevented because of the use of the constraining layer to isolate the monolithic structure from the die. (5) Multilayer ceramics with even more than six layers can be fabricated by applying the constraining layers with the windows between the dielectric layers of the dielectric body. (6) The heterogeneous material can be directly disposed on the dielectric layer to be fired.

The low-temperature-cofired ceramics produced according to the present invention can be coated/applied with a nickel/tin layer and then disposed with an integrated circuit, a multilayer ceramic circuit, a resistor SMD on the surface. The yield is then determined.

The following examples are given for the purpose of illustration only but not intended to limit the scope of the present invention.

EXAMPLE 1

Material components of a dielectric layer (Ca—AlSi) or those of a constraining layer (aluminum oxide and borosilicate glass) were filled into two jars and water was added to maintain the amount of solids to about 65% by weight. The components were ground to average particle size of about 0.8 μm. Polyvinyl alcohol (PVA), an organic bonding agent and polyethylene glycol (PEG), a plasticizers were further added to form a slip by passing the cast slurry under a blade as a dielectric layer with the thickness of about 80 μm. The method for producing a constraining layer is similar to that of the dielectric layer.

Each of the dielectric layers (10 cm×10 cm) comprised 25 active areas with the area of 1 cm×1 cm, and the distance between each active area was 0.65 cm and the distance between the outermost active area and the edge of the dielectric layer was 1.2 cm. Each active area was disposed with a heterogeneous material-pattern.

The windows were formed by directly punching the constraining layer (10 cm×10 cm). Each of the windows had the area of 1 cm×1 cm, and the distance between each window was 0.65 cm and the distance between the outermost window and the edge of the constraining layer was 1.2 cm.

The dielectric layers and the constraining layer were collated and laminated in the way of a constraining layer (positioned on the top of the dielectric body)—multiple dielectric layers—a constraining layer (positioned on the bottom of the dielectric body). The thickness of the constraining layer was $L_3$ and the total thickness of dielectric body was $L_4$.

Firing conditions used in this example were at about 300° C. for about 24 to about 38 hours for removing the organic binder, and then at about 880° C. for about 30 minutes. The sample was then cooled and cut directly according to the circuits printed.

The X-Y dimension shrinkage rates of the monolithic structure under different values of $L_3$ and $L_4$ were measured and listed in Table 1:

TABLE 1

| $L_4/L_3$ | X-Y shrinkage rate (%) |
|---|---|
| 0.0 | 0.1 |
| 3.1 | 0.5 |
| 4.4 | 0.8 |
| 4.8 | 1.0 |
| 6.4 | 1.6 |
| 6.6 | 1.4 |
| 11.0 | 3.8 |

After firing, the low-temperature-cofired ceramics was singulated along the edges of the windows.

It showed that when the ratio of L4/L3 is less than 3.1, the shrinkage rate of the monolithic structure in the X-Y dimension was less than about 0.5%.

EXAMPLE 2

The dielectric body with the thickness of about 300 μm and the constraining layers with the thickness of about 145 μm and about 10 μm were produced according to the method similar to that as described in Example 1. The 145 μm constraining layers were positioned on the top and bottom of the dielectric body and the 10 μm constraining layers were for being positioned between the dielectric layers of the dielectric body.

Each of the dielectric layers (10 cm×10 cm) comprised 25 active areas with the area of 1 cm×1 cm, and the distance between each active area was 0.65 cm and the distance between the outermost active area and the edge of the dielectric layer was 1.2 cm. Each active area was disposed with a heterogeneous material pattern.

The windows were formed by directly punching the constraining layer (10 cm×10 cm). Each of the windows had the area of 1 cm×1 cm, and the distance between each window was 0.65 cm and the distance between the outermost window and the edge of the constraining layer was 1.2 cm.

The dielectric layers and the constraining layers were laminated in the way of a constraining layer (145 μm, positioned on the top of the dielectric body)—m dielectric layers and n constraining layers (10 μm, positioned within the dielectric body) alternated—a constraining layer (145 μm, positioned on the bottom of the dielectric body) to form the monolithic structure, wherein m is equal to n+1.

The X-Y dimension shrinkage rates of the monolithic structure under different values of m were measured and listed in Table 2:

TABLE 2

| n | X-Y shrinkage rate (%) |
|---|---|
| 0 | 1.84 |
| 1 | 1.77 |
| 2 | 1.69 |

It showed that the constraining layer (10 μm) positioned within the dielectric body can reduce the shrinkage rate of the monolithic structure in the X-Y dimension from 1.84% to 1.69%.

EXAMPLE 3

The dielectric body with the thickness of about 800 μm and the constraining layers with the thickness of about 250 μm were produced according to the method similar to that as described in Example 1 except that the constraining layer comprised n % of borosilicate glass. The constraining layers were for being positioned on the dielectric body as the first and third constraining layers.

The dielectric layers (10 cm×10 cm) comprised 25 active areas with the area of 1 cm×1 cm, and the distance between each active area was 0.65 cm and the distance between the outermost active area and the edge of the dielectric layer was 1.2 cm. Each active area was disposed with a heterogeneous material pattern.

The windows were formed by directly punching the constraining layer (10 cm×10 cm). Each of the windows had the area of 1 cm×1 cm, and the distance between each window was 0.65 cm and the distance between the outermost window and the edge of the constraining layer was 1.2 cm.

The X-Y dimension shrinkage rates of the monolithic structure under different values of n were measured and listed in Table 3: Table 3:

TABLE 3

| n | X-Y shrinkage rate (%) |
|---|---|
| 0 | 0.68 |
| 2 | 0.28 |

It showed that addition of borosilicate glass was effective on reducing the X-Y dimension shrinkage rate.

While embodiments of the present invention have been illustrated and described, various modifications and improvements can be made by persons skilled in the art. The embodiments of the present invention are therefore described in an illustrative but not restrictive sense. It is intended that the present invention is not limited to the particular forms as illustrated, and that all the modifications not departing from the spirit and scope of the present invention are within the scope as defined in the appended claims.

The invention claimed is:

1. A method for reducing shrinkage during sintering low-temperature-cofired ceramics, the ceramics comprising a dielectric portion and a heterogeneous material portion, the method comprising the steps of:
    (a) providing a dielectric body comprising at least one dielectric layer of low temperature-cofired ceramic and that comprises at least one active area wherein said active area is disposed with at least one heterogeneous material pattern, and said heterogeneous material pattern comprises at least one heterogeneous material component and/or module;
    (b) positioning a constraining layer on the top of the dielectric body to form a monolithic structure, the constraining layer comprising at least one window and wherein the edge of the active area of the dielectric layer each falls within the window in vertical direction; wherein the constraining layer positioned on the top of the dielectric body is a low-sintering-temperature constraining layer with a sintering temperature lower than that of the dielectric layer and comprises about 1 wt% to about 10 wt% of vanadium oxide to lower the sintering temperature of the constraining layer to a temperature less than the sintering temperature of the dielectric layer;
    (c) firing the monolithic structure to a temperature first to sinter the constraining layer before the low-temperature-cofired ceramic starts to sinter then to sinter the low-sintering-temperature ceramic to reduce shrinkage of the low-temperature-cofired ceramic; and
    (d) singulating the monolithic structure along a cutting line to provide the low-temperature-cofired ceramics, wherein the cutting line is disposed in the area formed between the edge of the window and the edge of the active area to provide a low-temperature-cofired ceramic comprising vanadium oxide.

2. The method according to claim 1, wherein the constraining layer comprises about 1 wt% to about 10 wt% of a bonding glass.

3. The method according to claim 2, wherein the constraining layer comprises about 1 wt% to about 6wt% of bonding glass.

* * * * *